United States Patent
Wissel

(10) Patent No.: US 6,624,677 B1
(45) Date of Patent: Sep. 23, 2003

(54) RADIATION TOLERANT FLIP-FLOP

(75) Inventor: Larry Wissel, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/064,378

(22) Filed: Jul. 8, 2002

(51) Int. Cl.[7] .................... H03K 3/289; H03K 3/356
(52) U.S. Cl. ................................. 327/202; 327/203
(58) Field of Search .............................. 327/202, 203, 327/218, 208–212

(56) References Cited

U.S. PATENT DOCUMENTS

| | | | |
|---|---|---|---|
| 3,786,282 A | | 1/1974 | Orndorff ................ 327/216 |
| 4,785,200 A | * | 11/1988 | Huntington .............. 327/203 |
| 4,797,804 A | | 1/1989 | Rockett, Jr. ............. 365/154 |
| 5,111,429 A | * | 5/1992 | Whitaker ................ 365/156 |
| 5,144,158 A | | 9/1992 | Kanai et al. ............ 327/199 |
| 5,408,138 A | * | 4/1995 | Khosravi et al. ......... 327/203 |
| 5,504,703 A | | 4/1996 | Bansal ................... 365/156 |
| 5,703,513 A | * | 12/1997 | Hashizume et al. ....... 327/202 |
| 5,905,393 A | * | 5/1999 | Rinderknecht et al. .... 327/202 |
| 6,483,363 B1 | * | 11/2002 | Karnik et al. ............ 327/211 |

OTHER PUBLICATIONS

US 2001/0006350 A1, "Nagata", Jul. 7, 2001.*

* cited by examiner

*Primary Examiner*—Tuan T. Lam
(74) *Attorney, Agent, or Firm*—Schmeiser, Olsen & Watts; Richard A. Henkler

(57) ABSTRACT

A flip-flop circuit comprising: a master latch circuit; a slave latch circuit coupled to the master latch circuit; and a correction circuit for increasing an amount of charge that can be absorbed by the master latch circuit in response to a soft-error event when the slave latch circuit is in a transparent phase and when both the master and slave latch circuits are storing the same data.

19 Claims, 5 Drawing Sheets

RADIATION TOLERANT FLIP-FLOP

BACKGROUND OF THE INVENTION

1. Field of the Invention

The present invention relates to the field of complementary-metal-oxide-silicon (CMOS) latch circuits; more specifically, it relates to a method of reducing the sensitivity of a master-slave flip-flop to radiation induced soft error events.

2. Background of the Invention

As geometries and operating voltages of advanced semiconductor devices and integrated circuits decrease, integrated circuits become more susceptible to temporary upsets in stored data (soft errors) caused by exposure to radiation. Radiation includes radiation due to high-energy atomic particles of either cosmic or terrestrial origin. High-energy particle collision with silicon atoms of the semiconductor substrate create electron-hole pairs that cause charge to collect within the circuit that takes time to dissipate. In particular, flip-flop circuits are especially vulnerable because it is impractical to apply error correction coding to a flip-flop (as would be applied to a memory circuit, for example) because flip-flops do not utilize the formal logical structure of words and bits. A soft error event in a flip-flop essentially builds charge on a storage node of the flip-flop. This charge must be dissipated to prevent an upset.

The sensitivity of a flip-flop circuit to a soft error event may be best understood by reference to FIG. 1. FIG. 1 is a schematic circuit diagram of a related art flip-flop circuit. In FIG. 1, flip-flop 100 includes a master latch 105 and a slave latch 110. Master latch 105 includes first and second inverters 115 and 120, first and second AND gates 125 and 130 and first and second NOR gates 135 and 140. Slave latch 110 includes third and fourth AND gates 145 and 150 and third and fourth NOR gates 155 and 160.

In master latch 105, a DATA signal is coupled to a first input of first AND gate 125 and through first inverter 115 to a first input of second AND gate 130. A CLK signal is coupled through second inverter 120 to a second input of second AND gate 130 to a second input of first AND gate 125. The output of first AND gate 125 is coupled to a first input of first NOR gate 135 and the output of second AND gate 130 is coupled to a first input of second NOR gate 140. The output of first NOR gate 135 is coupled to a node A and the output of second NOR gate 140 is coupled to a node B. Node A is coupled to a second input of second NOR gate 140 and node B is coupled to a second input of first NOR gate 135. A master latch output signal Qm is developed at node B and a master latch output signal QmN is developed at node A.

In slave latch 110, node A is coupled to a first input of third AND gate 145 and node B is coupled to a first input of fourth AND gate 150. The CLK signal is coupled to a second input of third AND gate 145 and to a second input of fourth AND gate 150. The output of third AND gate 145 is coupled to a first input of third NOR gate 155 and the output of fourth AND gate 150 is coupled to a first input of fourth NOR gate 160. The output of third NOR gate 155 is coupled to a node C and the output of fourth NOR gate 160 is coupled to a node D. Node C is coupled to a second input of fourth NOR gate 160 and node D is coupled to a second input of third NOR gate 155. A slave latch output signal Qs is developed at node C and a slave latch output signal QsN is developed at node D.

When the CLK signal is low, a new data signal from DATA is "clocked" unto master latch 105. Master latch 105 is in the transparent phase. During the transparent phase, nodes A and B are immune to a soft error event because the DATA signal will correct an upset in master latch 105 during this time. Similarly, when the CLK signal is high, data in master latch 105 is "clocked" unto into slave latch 110. Slave latch 110 is in the transparent phase. During the transparent phase, nodes C and D are immune to a soft error event because data in master latch 105 will correct an upset in slave latch 110 during this time. However, when master latch 105 is not transparent a soft error event that changes the data on nodes A and B cannot be corrected because the DATA signal is "locked" out. Upon the next clock cycle, incorrect data will be "clocked" into or out of slave latch 110.

Techniques to reduce the sensitivity of flip-flop circuits include: increasing device sizes (which increases capacitance and thence reduces speed) and implementing redundancy. Both these solutions require increased silicon area and more power which are counter productive to the original goals of smaller size and lower voltage that led to the soft-error sensitivity originally.

Thus, an improved technique is needed for reducing the sensitivity of flip-flop circuits to radiation induced soft error events.

BRIEF SUMMARY OF THE INVENTION

A first aspect of the present invention is a flip-flop circuit comprising: a master latch circuit; a slave latch circuit coupled to the master latch circuit; and a correction circuit for increasing an amount of charge that can be absorbed by the master latch circuit in response to a soft-error event when the slave latch circuit is in a transparent phase and when both the master and slave latch circuits are storing the same data.

A second aspect of the present invention is a master-slave flip-flop circuit comprising: a first latch circuit having input terminals for receiving and latching a data signal and for receiving a clock signal and having output terminals providing first latched data signals in response to a first state of the clock signal; a second latch circuit having input terminals coupled to the output terminals of the first latch circuit for receiving and latching the data signals and having output terminals providing second latched data signals in response to a second state of the clock signal; a correction circuit coupled between the output terminals of the second latch circuit and the output terminals of the first latch circuit, the correction circuit operable to apply, from the output of the second latch circuit, the latched data signals of the second latch circuit to the output of the first latch circuit when the first and the second latched signals are the same and the clock signal is in the second state.

A third aspect of the present invention is a master-slave flip-flop circuit comprising: a first latch circuit having input terminals for receiving and latching a data signal and for receiving a clock signal and for providing first latched data signals to a set of nodes in response to a first state of the clock signal; a second latch circuit coupled to the set of nodes for receiving and latching the data signals and having output terminals providing latched data signals in response to a second state of the clock signal; a low node correction circuit coupled between the output terminals of the second latch circuit and the set of nodes, the correction circuit operable to apply data signals from the output of the second latch circuit to low nodes of the set of nodes when the first and the second data latched signals are the same and the clock signal is in the second state. The third aspect of the present invention further includes a high node correction circuit coupled between the output terminals of the second latch circuit and the set of nodes, the correction circuit operable to apply data signals from the output of the second latch circuit to high nodes of the set of nodes when the first and the second latched data signals are the same and the clock signal is in the second state.

BRIEF DESCRIPTION OF THE SEVERAL VIEWS OF THE DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION OF THE INVENTION

Figure 1:
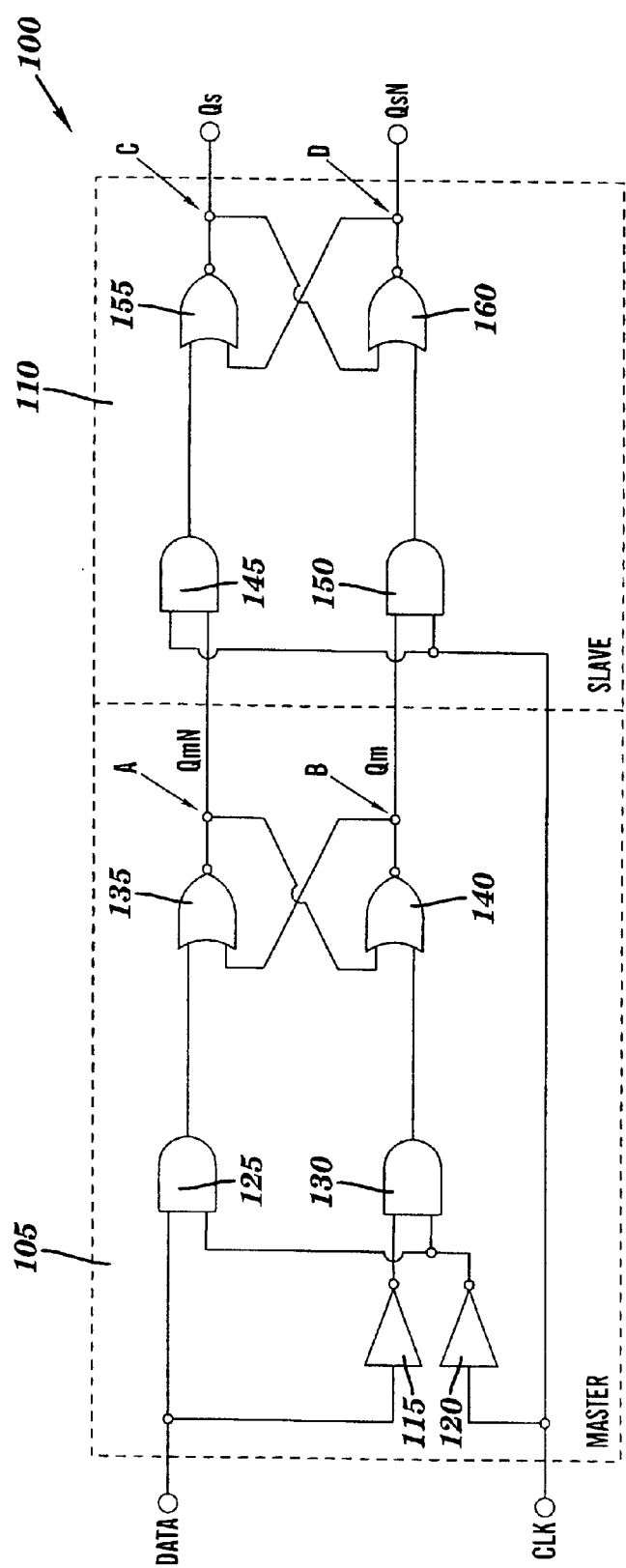
FIG. 1 is a schematic circuit diagram of a related art flip-flop circuit.
Figure 2:
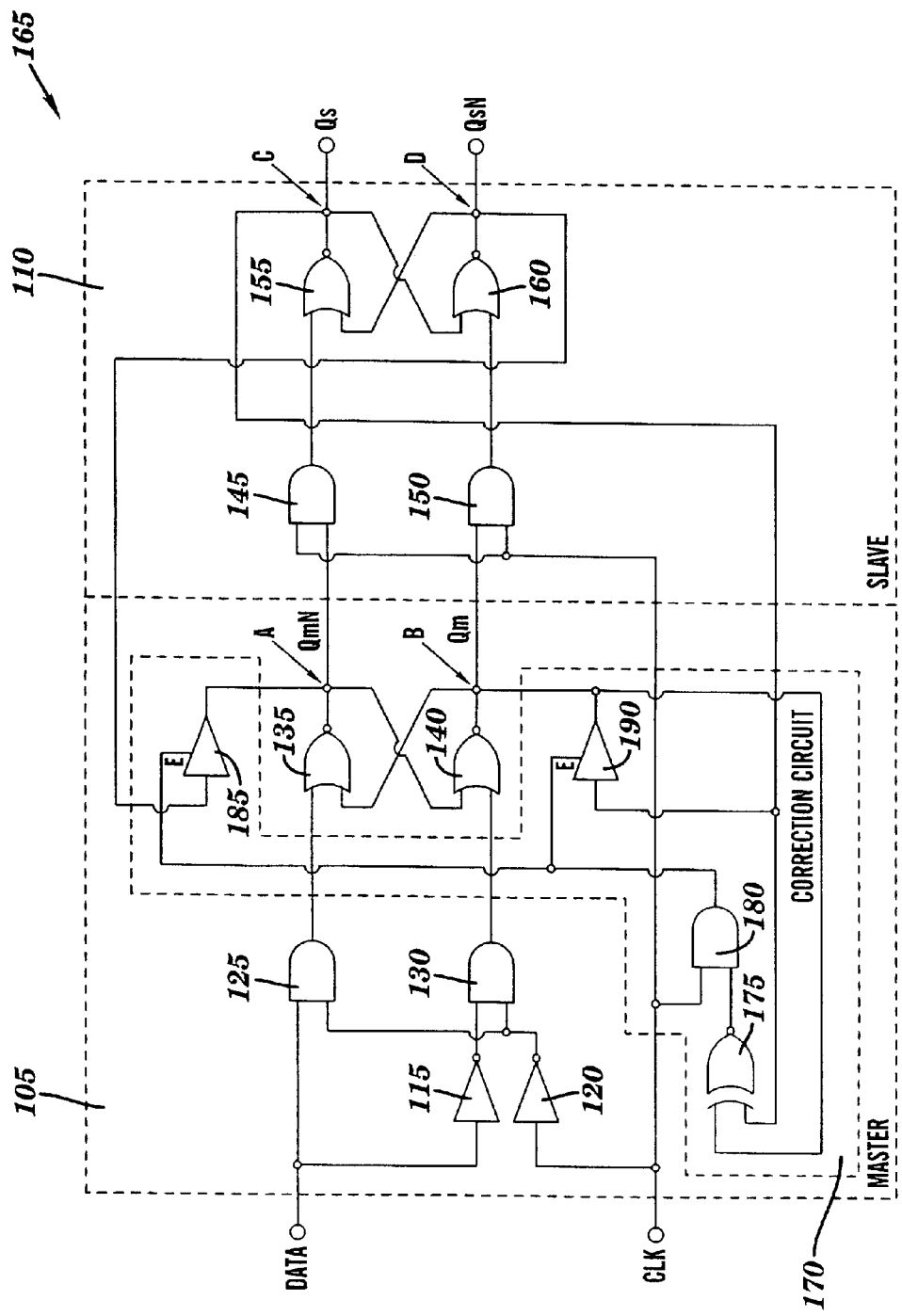
FIG. 2 is a schematic circuit diagram of the flip-flop circuit of FIG. 1 having a correction circuit for reducing the sensitivity of the master latch to a soft error event and illustrates a first embodiment of the present invention.

FIG. 2 is a schematic circuit diagram of the flip-flop circuit of FIG. 1 having a correction circuit for reducing the sensitivity of the mater latch to a soft error event and illustrates a first embodiment of the present invention. In FIG. 2, flip-flop 165 includes master latch 105, slave latch 110 and a correction circuit 170. Master latch 105 includes first and second inverters 115 and 120, first and second AND gates 125 and 130 and first and second NOR gates 135 and 140. Slave latch 110 includes third and fourth AND gates 145 and 150 and third and fourth NOR gates 155 and 160. Correction circuit 170 includes a XNOR gate 175, a fifth AND gate 180 and first and second three-state-drivers 185 and 190.

In master latch 105, the DATA signal is coupled to a first input of first AND gate 125 and through first inverter 115 to a first input of second AND gate 130. A CLK signal is coupled to through second inverter 120 to a second input of second AND gate 130 and a second input of first AND gate 125. The output of first AND gate 125 is coupled to a first input of first NOR gate 135 and the output of second AND gate 130 is coupled to a first input of second NOR gate 140. The output of first NOR gate 135 is coupled to a node A and the output of second NOR gate 140 is coupled to a node B. Node A is coupled to a second input of second NOR gate 140 and node B is coupled to a second input of first NOR gate 135. A master latch output signal Qm is impressed at node B and a master latch output signal QmN is impressed at node A.

In slave latch 110, node A is coupled to a first input of third AND gate 145 and node B is coupled to a first input of fourth AND gate 150. The CLK signal is coupled to a second input of third AND gate 145 and to a second input of fourth AND gate 150. The output of third AND gate 145 is coupled to a first input of third NOR gate 155 and the output of fourth AND gate 150 is coupled to a first input of fourth NOR gate 160. The output of third NOR gate 155 is coupled to a node C and the output of fourth NOR gate 160 is coupled to a node D. Node C is coupled to a second input of fourth NOR gate 160 and node D is coupled to a second input of third NOR gate 155. A slave latch output signal Qs is impressed at node C and a slave latch output signal QsN is impressed at node D.

In correction circuit 170, a first input of XNOR gate 175 is coupled to node B of master latch 105 and a second input of the XOR gate to node C of slave latch 110. The output of XNOR gate 175 is coupled to a first input of fifth AND gate 180 and the CLK signal is coupled to a second input of the fifth AND gate. The output of fifth AND gate 180 is coupled to the enable (E) of each three-state-driver 185 and 190. The input of first three-state-driver 185 is coupled to node D of slave latch 110 and the input of second three-state-driver 190 is coupled to node C of the slave latch. The output of first three-state-driver 185 is coupled to node A of master latch 105 and the output of second three-state-driver 190 is coupled to node B of the master latch.

When master latch output signal Qm and slave output signal Qs are equal (by necessity QmN and QsN will also be equal) the output of XNOR gate 175 is high. When the output of XNOR gate 175 is high and CLK is high the output of fifth AND gate 180 is high. When the output of fifth gate 180 is high, both first and second three-state-drivers 185 and 190 are enabled allowing data from slave latch 110 to feed back to master latch 105 and correction circuit 170 applies correcting charge to nodes A and B. Correction circuit 170 imparts partial soft-error event immunity to master latch 105 of flip-flop 165 only during the transparent phase of slave latch 110 and only when the data stored on the master latch and the slave latch are the same. By partial immunity, it is meant that the amount of charge that can be dissipated is a function of how much and how quickly correction circuit 170 can dissipate charge. If for a particular charge collection event, correction circuit 170 can dissipate the charge on the affected node before the next clock cycle, then the error is prevented; if not, the soft-error is not prevented. Therefore, design of correction circuit 170 should take into account the magnitude of expected charge events. If CLK signal is high and Qm=Qs then correction circuit 170 is active and first three-state-driver 185 feeds back data from node D to node A either reinforcing the state of node A if the charge was on node B or dissipating the charge if the charge was on node A, and second three-state-driver 190 feeds back data from node C to node B either reinforcing the state of node B if the charge was on node A or dissipating the charge if the charge was on node B. Note, both master latch 105 and slave latch 110 are immune during their respective transparent phases as described above in reference to FIG. 1.

Figure 3:
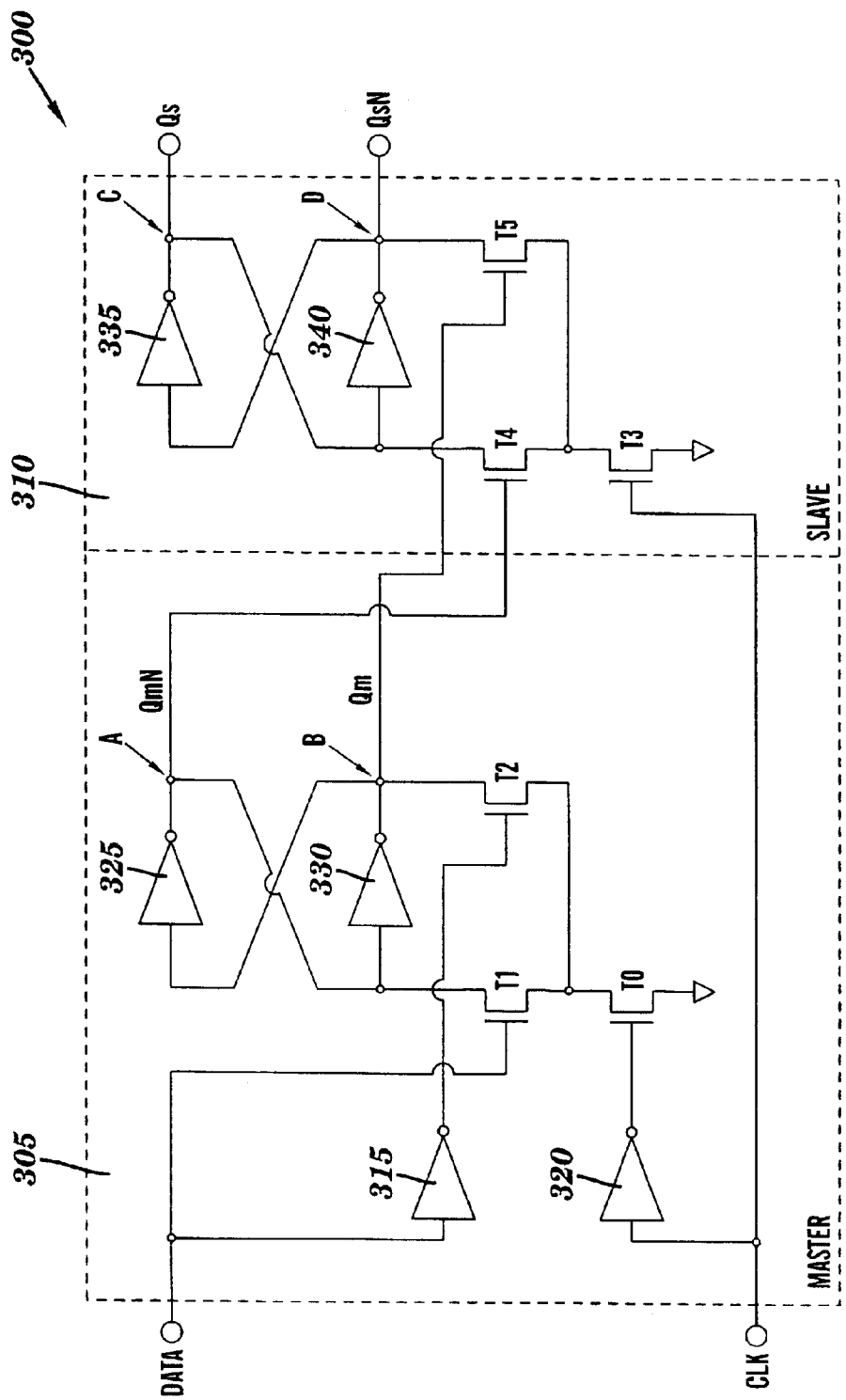
FIG. 3 is a schematic circuit diagram of a second latch circuit without a correction circuit.

FIG. 3 is a schematic circuit diagram of a second latch circuit without a correction circuit. In FIG. 3, flip-flop 300 includes a master latch 305 and a slave latch 310. Master latch 305 includes first, second, third and fourth inverters 315, 320, 325 and 330, and NFETs T0, T1 and T2. Slave latch 310 includes fifth and sixth invertors 335 and 340 and NFETs T3, T4 and T5.

In master latch 305, a DATA signal is coupled to the input of first inverter 315 and the gate of NFET T1. The output of first inverter 315 is coupled to the gate of NFET T2. A CLK signal is coupled to the input of second inverter 320. The output of second inverter 320 is coupled to the gate of NFET T0. The sources of NFETs T1 and T2 are coupled to the drain of NFET T0 and the source of NFET T0 is coupled to ground. The drain of NFET T1 is coupled to the input of fourth inverter 330 and a node A. The drain of NFET T2 is coupled to node B and the input of third inverter 325. The output of third inverter 325 is coupled to node A and the output of fourth inverter 330 is coupled to node B. A master latch output signal Qm is impressed at node B and a master latch output signal QmN is impressed at node A.

In slave latch 310, the gate of NFET T3 is coupled to the CLK signal. The gate of NFET T4 is coupled to node A of master latch 305 and the gate of NFET T5 is coupled to node B of the master latch. The sources of NFETs T4 and T5 are coupled to the drain of NFET T3 and the source of NFET T3 is coupled to ground. The drain of NFET T4 is couple to the input of sixth inverter 340 and a node C. The drain of NFET T5 is coupled to a node D and the input of fifth inverter 335. The output of fifth inverter 335 is coupled to node C and the output of sixth inverter 340 is coupled to node D. A slave latch output signal Qs is impressed at node C and a slave latch output signal QsN is impressed at node D.

When the CLK signal is low, a new data signal from DATA is "clocked" unto master latch 305. Master latch 305 is in the transparent phase. During the transparent phase, nodes A and B are immune to a soft error event because the DATA signal will correct an upset in master latch 305 during this time. Similarly, when the CLK signal is high, data in master latch 305 is "clocked" into slave latch 310. Slave latch 310 is in the transparent phase. During the transparent phase, nodes C and D are immune to a soft error event because data in master latch 305 will correct an upset in slave latch 310 during this time. However, when master latch 300 is not transparent a soft error event that changes the data on nodes A and B can not be corrected because the DATA signal is "locked" out. Because slave latch 310 is transparent when master latch 305 is not transparent, this incorrect data will be written into slave latch 310.

Figure 4:
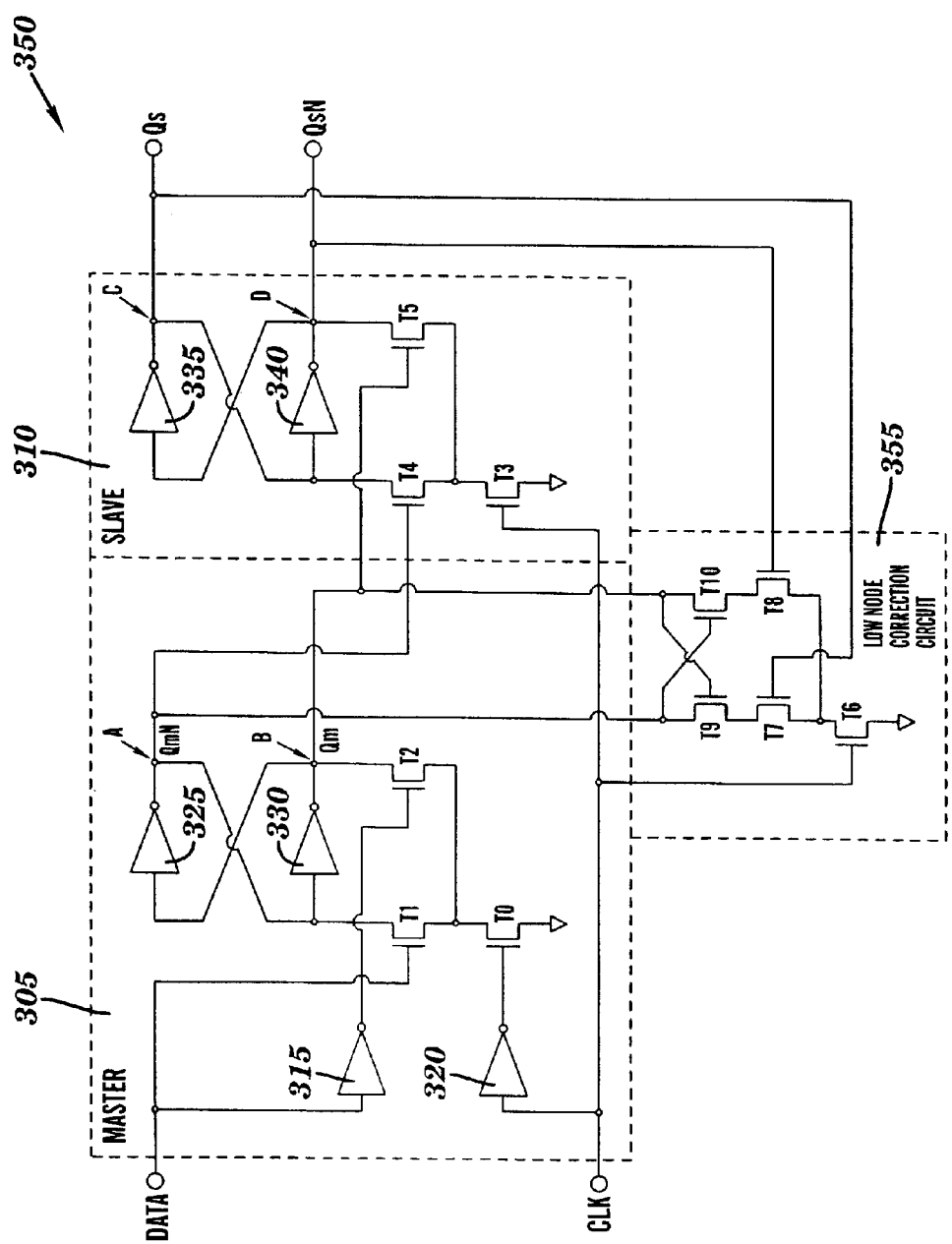
FIG. 4 is a schematic circuit diagram of the second latch circuit of FIG. 3 having a low node correction circuit for reducing the sensitivity of the master latch to a charge collection event and illustrates a second embodiment of the present invention.

FIG. 4 is a schematic circuit diagram of the second latch circuit of FIG. 3 having a low node correction circuit for reducing the sensitivity of the master latch to a charge collection event and illustrates a second embodiment of the present invention. In FIG. 4, flip-flop 350 includes master latch 305, slave latch 310 and a low node correction circuit 355. The description of master latch 305 and slave latch 310 are described above in reference to FIG. 3. Low node correction circuit 355 includes NFETs T6, T7, T8, T9, and T10.

In low node correction circuit 355, node A of master latch 305 is coupled to the drain of NFET T9 and the gate of NFET T10. Node B of master latch 305 is coupled to the drain of NFET T10 and the gate of NFET T9. The source of NFET T9 is coupled to the drain of NFET T7. The drain of NFET T10 is coupled to the source of NFET T8. The sources of NFETs T7 and T8 are coupled to the drain of NFET T6 and the source of NFET T6 is coupled to ground. The gate of NFET T7 is coupled to node C of slave latch 310 and the gate of NFET T8 is coupled to node D of the slave latch.

When the CLK signal is high NFET T6 is on. If Qm=Qs= high, then NFETs T7 and T9 turn on and node A is low and NFETs T6, T7 and T9 provide additional charge dissipation capability to node A. If QmN=QsN=high then NFETs T8 and T10 turn on and node B is low and NFETs T6, T8 and T10 provide additional charge dissipation capability to node B. Thus when master latch 305 and slave latch 310 both contain identical data, low node correction circuit 355 will apply negative charge to either node A or node B. If the CLK signal is high and Qm=Qs=high, then correction circuit 355 is active and NFETs T6, T7 and T9 dissipate the charge if the charge collection was on node A. If the CLK signal is high and Qm=Qs=low, then correction circuit 355 is active and NFETs T6, T8 and T10 dissipate the charge if the charge collection was on node B.

Low node correction circuit 355 imparts partial soft-error event immunity to low node soft-error events to master latch 305 of flip-flop 350 only during the transparent phase of slave latch 310 and only when the data stored on the master latch and the slave latch are equal. By partial immunity, it is meant that the amount of charge that can be dissipated is a function of how much and how quickly low node correction circuit 355 can dissipate positive charge. If for a particular soft-error event, low node correction circuit 355 can dissipate the charge on the affected node before the next clock cycle, then the charge does not become an error; if not, the soft-error is prevented. Therefore, design of correction circuit 355 should take into account the magnitude of expected positive charge soft-error events. Note, both master latch 305 and slave latch 310 are immune during their respective transparent phases as described above in reference to FIG. 3.

Low node correction circuit 355 protects against positive charge collection on previously low nodes. To provide partial immunity against negative charge collection on previously high nodes a mirror image PFET circuit of correction circuit 355 may be provided. This is illustrated in FIG. 5 and described below.

Figure 5:
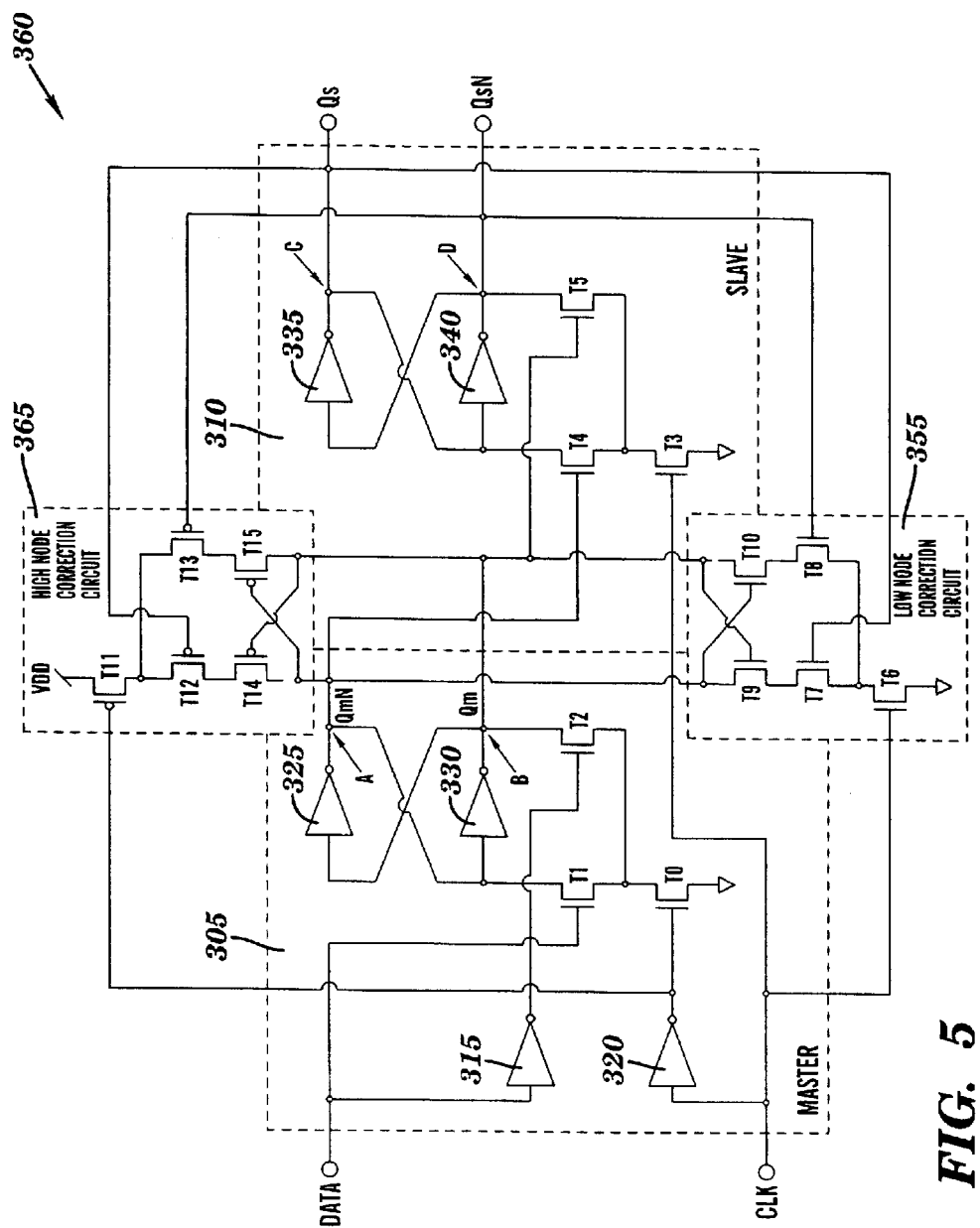
FIG. 5 is a schematic circuit diagram of the second latch circuit of FIG. 4 additionally having a high node correction circuit for reducing the sensitivity of the master latch to a soft error event and illustrates a third embodiment of the present invention.

FIG. 5 is a schematic circuit diagram of the second latch circuit of FIG. 4 additionally having a high node correction circuit for reducing the sensitivity of the master latch to a soft error event and illustrates a third embodiment of the present invention. In FIG. 5, flip-flop 360 includes master latch 305, slave latch 310, low node correction circuit 355 and a high node correction circuit 365. The description of master latch 305, slave latch 310 and low node correction circuit 355 are described above in reference to FIG. 4. High node correction circuit 365 includes PFETs T11, T12, T13, T14, and T15.

In high node correction circuit 365, node A of master latch 305 is coupled to the drain of PFET T14 and the gate of PFET T15. Node B of master latch 305 is coupled to the drain of PFET T15 and the gate of PFET T14. The source of PFET T14 is coupled to the drain of PFET T12. The drain of PFET T15 is coupled to the source of PFET T13. The sources of PFETs T12 and T13 are coupled to the drain of PFET T11 and the source of PFET T11 is coupled to VDD. The gate of PFET T12 is coupled to node C of slave latch 310 and the gate of PFET T13 is coupled to node D of the slave latch.

When the CLK signal is high (note the gate of PFET T11 is receiving a low signal because of second inverter 320) PFET T11 is on. If Qm=Qs=low, then PFETs T12 and T14 turn on and node A is high and T11, T12 and T14 provide additional charge capability to node A. If QmN=QsN=low then PFETs T13 and T15 turn on and node B is high and PFETs T11, T13 and T15 provide additional charge capability to node B. Thus when master latch 305 and slave latch 310 both contain identical data, high node correction circuit 365 applies positive charge to either node A or node B. If the CLK signal is high and Qm=Qs=high then second correction circuit 365 is active and either PFETs T11, T12 and T14 dissipate the charge if the charge collection was on node A. If the CLK signal is high and Qm=Qs=low, then correction circuit 365 is active and PFETs T11, T13 and T15 dissipate the charge if the charge was on node B.

High node correction circuit 365 imparts partial soft-error event immunity to high node soft-error events to master latch 305 of flip-flop 350 only during the transparent phase of slave latch 310 and only when the data stored on the master latch and the slave latch are equal. By partial immunity, it is meant that the amount of charge that can be dissipated is a function of how much and how quickly high node correction circuit 365 can supply positive charge. If for a particular soft-error event, high node correction circuit 365 can dissipate the charge on the effected node before the next clock cycle, then the error the charge collection does not become an error; if not, the soft-error is not prevented. Therefore, design of high node correction circuit 365 should take into account the magnitude of expected negative charge soft-error events. Note, both master latch 305 and slave latch 310 are immune during their respective transparent phases as described above in reference to FIG. 3 and first correction circuit 355 still acts as described above in reference to FIG. 4.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore it is intended that the following claims cover all such modifications and changes as fall within the true spirit and scope of the invention.

What is claimed is:

1. A flip-flop circuit comprising:
   a master latch circuit;
   a slave latch circuit coupled to said master latch circuit; and
   a correction circuit for increasing an amount of charge absorbable by said master latch circuit in response to a soft-error event only when said slave latch circuit is in a transparent phase and both said master and slave latch circuits are storing the same data.

2. The flip-flop circuit of claim 1, wherein said soft-error event is a radiation exposure event.

3. The flip-flop circuit of claim 1, wherein said correction circuit increases the amount of positive charge, negative charge or both the amount of both positive and negative charge absorbable by said master latch.

4. The flip-flop circuit of claim 1, wherein said correction circuit operates in response to feed back of the state of said slave latch circuit.

5. The flip-flop circuit of claim 1, wherein said master and slave latch circuits each include a pair of AND gates operably connected to a pair of cross-coupled NOR gates.

6. The flip-flop circuit of claim 1, wherein said correction circuit includes three-state drivers for driving data signals from outputs of said slave latch circuit onto outputs of said master latch circuit.

7. The flip-flop circuit of claim 1, wherein said correction circuit includes means for determining when said master and slave latch circuits are the storing the same data.

8. The flip-flop circuit of claim 1 where in said master latch circuit, said slave latch circuit and said correction circuit are each responsive to a same clock signal.

9. A master-slave flip-flop circuit comprising:
   a first latch circuit having input terminals for receiving and latching data signals and a clock signal and having output terminals providing first latched data signals in response to a first state of said clock signal;
   a second latch circuit having input terminals coupled to said output terminals of said first latch circuit for receiving and latching said first latched data signals and having an output terminal providing second latched data signals in response to a second state of said clock signal;
   a correction circuit directly connected to said output terminals of said second latch circuit and directly connected to said output terminals of said first latch circuit, said correction circuit operable to apply, from said output of said second latch, said second latched data signals from said second latch circuit to said output of said first latch circuit only when said first and said second latched data signals are the same and said clock signal is in said second state.

10. The master-slave flip-flop circuit of claim 9, wherein said first and second latch circuits each include a pair of AND gates operably connected to a pair of cross-coupled NOR gates.

11. The master-slave flip-flop circuit of claim 9, wherein said correction circuit includes means for driving said second latched data signals onto said outputs of said first latch circuit.

12. The master-slave flip-flop circuit of claim 11, wherein said driving means includes three-state drivers.

13. The master-slave flip-flop circuit of claim 9, wherein said correction circuit includes means for determining when said first and second latched data signals are the same.

14. The master-slave flip-flop circuit of claim 13, wherein said means for determining includes a XNOR gate.

15. The master-slave flip-flop circuit of claim 9, wherein said first latched data signals and said second latched data signals comprise complementary digital data.

16. A flip-flop circuit comprising:
   a master latch circuit;
   a slave latch circuit coupled to said master latch circuit; and
   a correction circuit for feeding back to said master latch circuit the state of said slave latch circuit only when said slave latch circuit is in a transparent phase and both said master and slave latch circuits are storing the same data.

17. The flip-flop circuit of claim 16, wherein said master latch circuit, said slave latch circuit and said correction circuit are operably responsive to a same clock signal.

18. The flip flop circuit of claim 16, wherein said correction circuit includes three-state drivers for driving data signals from outputs of said slave latch circuit onto outputs of said master latch circuit.

19. The flip-flop circuit of claim 16 wherein said correction circuit includes means for determining when said master and slave circuits are the storing the same data.

* * * * *